United States Patent [19]
Stone

[11] Patent Number: 5,471,594
[45] Date of Patent: Nov. 28, 1995

[54] DATA FORMATTER FOR FORMATTING VARIABLE LENGTH DATA WORDS INTO FIXED LENGTH DATA WORDS

[75] Inventor: Jonathan J. Stone, Reading, United Kingdom

[73] Assignee: Sony United Kingdom Limited, Staines

[21] Appl. No.: 248,637

[22] Filed: May 23, 1994

Related U.S. Application Data

[63] Continuation of Ser. No. 925,199, Aug. 6, 1992, abandoned.

[30] Foreign Application Priority Data

Oct. 11, 1991 [GB] United Kingdom .................... 9121669

[51] Int. Cl.$^6$ .................................................. H03M 7/40
[52] U.S. Cl. .................... 395/375; 395/500; 364/DIG. 1; 364/DIG. 2; 341/67
[58] Field of Search ......................... 341/67, 99; 395/375, 395/500

[56] References Cited

U.S. PATENT DOCUMENTS

| | | | |
|---|---|---|---|
| 4,376,933 | 3/1983 | Saran et al. ................................ | 341/99 |
| 4,502,111 | 2/1985 | Riffe et al. ................................ | 395/375 |
| 4,750,149 | 6/1988 | Miller ........................................ | 395/250 |
| 4,819,079 | 4/1989 | Takao ........................................ | 358/260 |
| 4,843,632 | 6/1989 | Lee et al. .................................. | 382/56 |
| 5,146,220 | 9/1992 | Ishikawa .................................... | 341/67 |
| 5,162,795 | 11/1992 | Shirota ...................................... | 341/67 |
| 5,173,695 | 12/1992 | Sun et al. .................................. | 341/67 |
| 5,216,518 | 6/1993 | Yamagami ................................ | 358/426 |

FOREIGN PATENT DOCUMENTS 2138184  10/1984  United Kingdom .
WO89/07372  8/1989  WIPO .

Primary Examiner—Parshotam S. Lall
Assistant Examiner—Zarni Maung
Attorney, Agent, or Firm—William S. Frommer; Alvin Sinderbrand

[57] ABSTRACT

A two stage data formatter is described for converting variable bit length code words into fixed bit length code words. The second formatting stage 12 splits the words into complete fixed length code words and returns any remainder bits to the first formatting stage 10. The first formatting stage 10 preprocesses the following data words by concatenating any remainder bits with the following variable bit length code word and updating its corresponding bit length code word. These preprocessed data words are then passed to the second formatting stage 12.

8 Claims, 3 Drawing Sheets

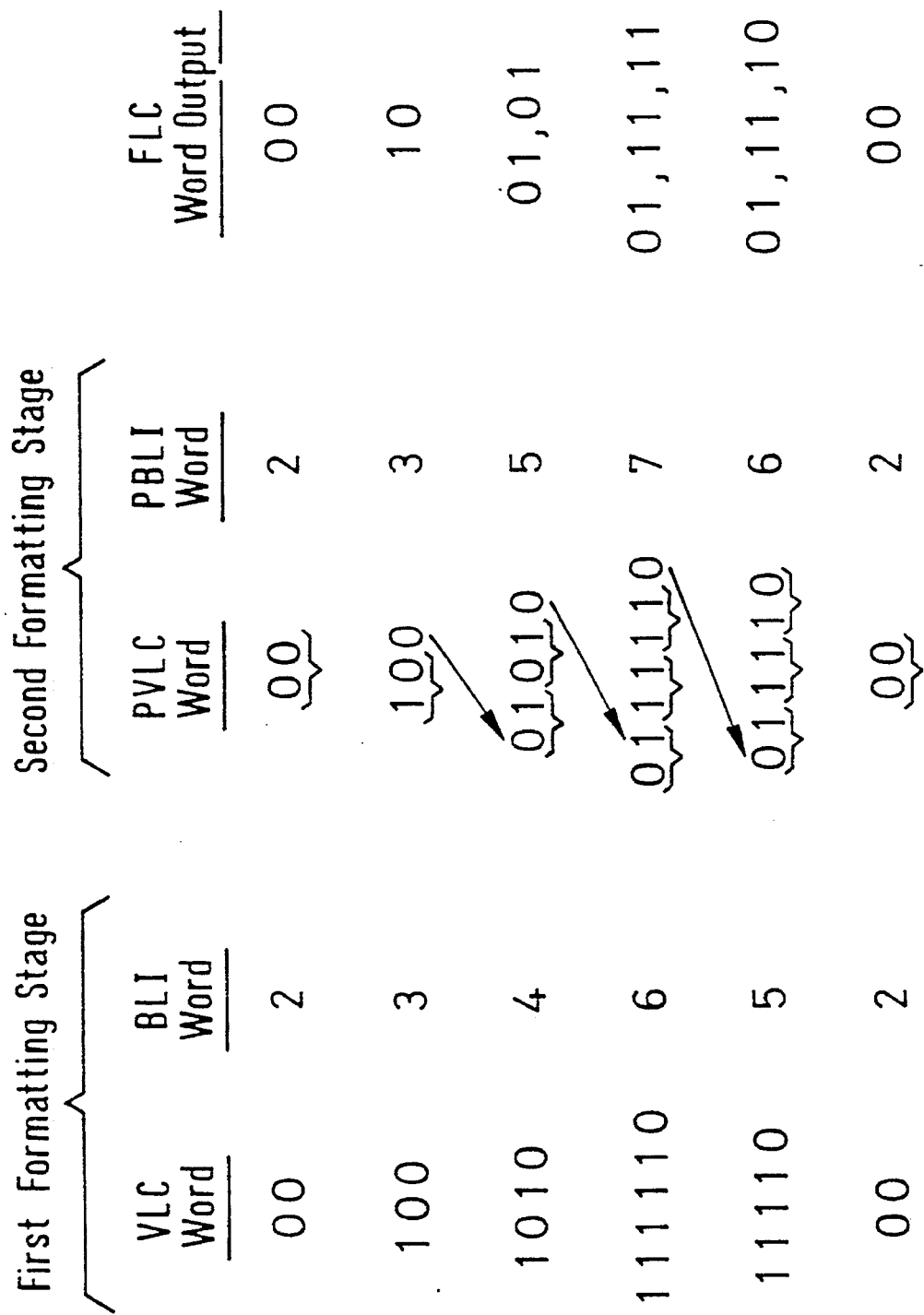

DATA FORMATTER FOR FORMATTING VARIABLE LENGTH DATA WORDS INTO FIXED LENGTH DATA WORDS

This application is a continuation of application Ser. No. 07/925,199, filed Aug. 6, 1992 now abandoned.

BACKGROUND OF THE INVENTION

1. Field of the Invention

This invention relates to the field of data formatting. More particularly, this invention relates to the formatting of variable bit length data words into a stream of fixed bit length data words.

2. Description of the Prior Art

An example of a system requiring such formatting is an image data compression system operating according to the data compression standard proposed by the Joint Photographic Experts Group (JPEG) and currently under review by the International Standards Organisation. FIG. 1 schematically illustrates the format and flow of data through such a system. Decorrelated data comprising a serial stream of digital data is applied to a node 2 and passes to an entropy encoder 4. The entropy encoder 4 carries out runlength and Huffman coding upon the input serial data stream to compress it into a sequence of variable length code (VLC) data words. These VLC data words are stored in a field store 6 prior to being passed to a data formatting unit 8. The function of the data formatting unit 8 is to take the sequence of VLC data words and to transform them into a stream of fixed length code (FLC) data words.

It will be appreciated that whilst such a data format conversion may be desirable for increased subsequent efficiency and simplicity, the data format conversion itself introduces an additional overhead. In a non real time system, such as still image processing and display in a computer system, this is not a particular problem. However, in a system dealing with data such as real time video image data, the high data rates present a particular challenge in providing data format conversion in a way that can keep pace with the overall data rate and only introduce a small time lag in the processing.

It is an object of the invention to provide a high speed data formatter for converting variable bit length data words into fixed bit length data words.

SUMMARY OF THE INVENTION

Viewed from one aspect, the present invention provides a data formatting apparatus for formatting variable bit length data words into a stream of fixed bit length data words, said data formatting apparatus comprising:

(i) a first formatting stage for receiving and preprocessing variable bit length data words and corresponding bit length indicating words; and (ii) a second formatting stage for receiving preprocessed variable bit length data words and corresponding preprocessed bit length indicating words and for generating fixed length data words from preprocessed variable bit length data words;

wherein, in use, said second formatting stage, acting in response to a preprocessed bit length indicating word, splits a corresponding preprocessed variable length data word into complete fixed length data words and any remainder bits, said complete fixed length data words being output from said data formatting apparatus with any remainder bits being returned to said first formatting stage, and said first formatting stage concatenates any returned remainder bits with a following variable length data word to generate a preprocessed variable length data word and increases a following corresponding bit length indicating word by the number of returned remainder bits to generate a preprocessed bit length indicating word.

Embodiments of the invention provide high rate data format conversion introducing a small time lag with the use of relatively inexpensive hardware. The invention is able to cope with variable bit length data words having both odd and even bit lengths. The fixed bit lengths data words can be chosen to have different fixed bit lengths depending on the requirements of the subsequent processing system.

The data formatting takes place in two stages. The second stage splits the data into the fixed bit length data words and returns any excess bits to the first stage. The first stage concatenates these returned bits with the following variable length data word and updates the corresponding data word which tells the system what length that variable bit length data word has. The data formatting apparatus effectively preprocesses the variable bit length data words to concatenate them with those bits, if any, of the previous variable bit length data word that would not fit into an complete fixed bit length data word.

It will be appreciated that whilst the overall function of the first formatting stage could be achieved in differing ways, some embodiments will meet the overall requirements better than others. In preferred embodiments of the invention said first formatting stage includes a plurality of data registers for receiving in parallel variable length data words, one of said data registers storing unshifted versions of said variable length data words and remaining data registers storing versions of said variable length data words left-shifted by differing amounts. The use of a plurality of data registers introduces a degree of hardware based parallel processing of the data words as they move through the formatter thereby increasing overall processing speed.

A preferred manner of exploiting the provision of a plurality of data registers in the first formatting stage is to provide a system in which said returned remainder bits are concatenated with said following variable bit length data word by being written into those stages of data registers storing left-shifted versions of said following variable length data words that are not occupied by bits of said following variable length data word.

The feeding of the variable bit length data words into the data registers can be hardwired, as can the connection to the second formatting stage for return of the remainder bits. An appropriate number of remainder bits will be fed to the vacant stages of the data registers depending on the degree to which they have been left/shifted e.g. if the variable bit length data words have been left/shifted by two bits, then the first two bits of the remainder bits can be fed to the two right hand stages of the data register.

Whilst the above mentioned technique of utilising a plurality of data registers containing versions of the variable bit length data word shifted to a greater or lesser extent is relatively fast, in operation only one of the data registers will contain valid data that should be passed to the second formatting stage. In order to only pass valid data to the second formatting stage, preferred embodiments of the invention further comprise a multiplexer coupling said plurality of data registers to said second formatting stage for selecting which versions of said variable length data words, corresponding to said preprocessed variable length data words, are passed from said first formatting stage to said second formatting stage.

The selection of which data register should be used as the source of data for the second formatting stage can also only be made when the second formatting stage knows the bit lengths of the variable bit length data word which is currently being processing by the second formatting stage. Accordingly, in preferred embodiments, said state machine controls said selection made by said multiplexer.

The second formatting stage is only able to determine what increase the first formatting stage should apply to the following bit length indicating word when the second formatting stage knows the bit length of the variable bit length data word currently being processed by the second stage. To carry out this function with appropriate speed in preferred embodiments of the invention, said second formatting stage includes a state machine responsive to said preprocessed bit length indicating word to control what increase said first formatting stage applies to said following corresponding bit length indicating word.

The splitting that must be carried out by the second formatting stage is also a potential limiting factor. In preferred embodiments of the invention said second formatting stage includes a format register for storing preprocessed variable length data words, and an output multiplexer coupled to said format register and acting under control of said state machine For splitting each preprocessed variable length data word into complete fixed length data words by connecting fixed size groups of stages from said format register to an output data bus.

It will be appreciated that the state machine plays an important role in the operation of preferred embodiments of the invention. In order to ease the construction and operation of the state machine it has been found advantageous to employ a system in which said second formatting stage includes a size register for receiving and storing preprocessed bit length indicating words and applying said stored preprocessed bit length indicating words to said state machine.

Viewed from a second aspect the invention provides a data formatting method for formatting variable bit length data words into a stream of fixed bit length data words, said data formatting method comprising the steps of (i) receiving and preprocessing variable bit length data words and corresponding bit length indicating words in a first data formatting operation; and (ii) receiving preprocessed variable bit length data words and corresponding bit length indicating words and generating fixed length data words from preprocessed variable bit length data words in a second data formatting operation;

wherein second data formatting operation, acting in response to a preprocessed bit length indicating word, splits a corresponding preprocessed variable length data word into complete fixed length data words and any remainder bits, outputs said complete fixed length data words and returns any remainder bits for use in said First formatting operation, and said first data formatting operation concatenates any returned remainder bits with a following variable length data word to generate a preprocessed variable length data word and increases a following corresponding bit length indicating word by the number of returned remainder bits to generate a preprocessed bit length indicating word.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 illustrates a sequence of variable bit length code words, their corresponding bit lengths and the fixed length two bit words to which they are transformed; and FIG. 4 illustrates the data words held in the first and second formatting stages during the processing of the data of FIG. 3.

DESCRIPTION OF THE PREFERRED EMBODIMENTS

Figure 1:
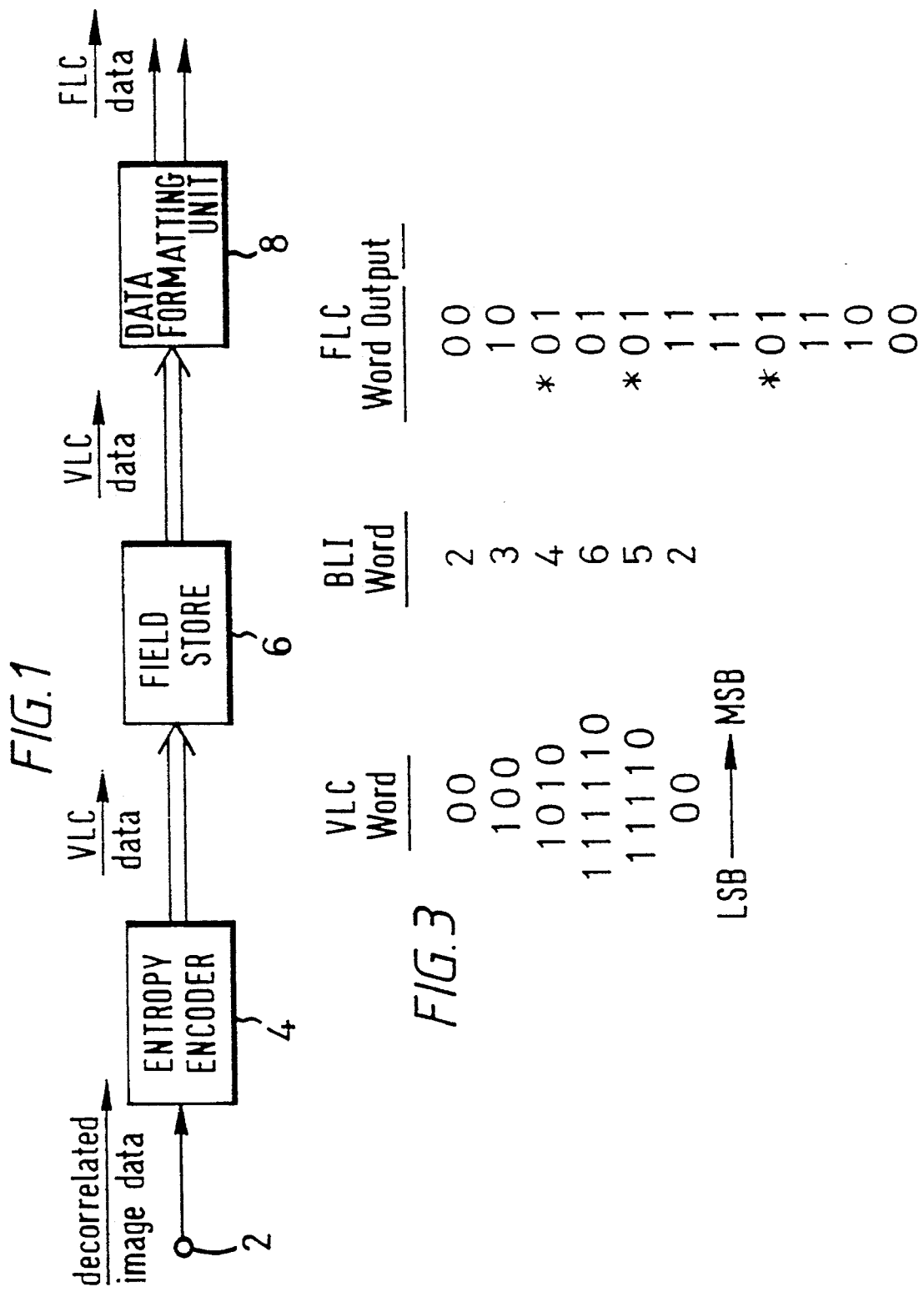
FIG. 1 schematically illustrates a system of the type in which a data format transformation is required.
Figure 2:
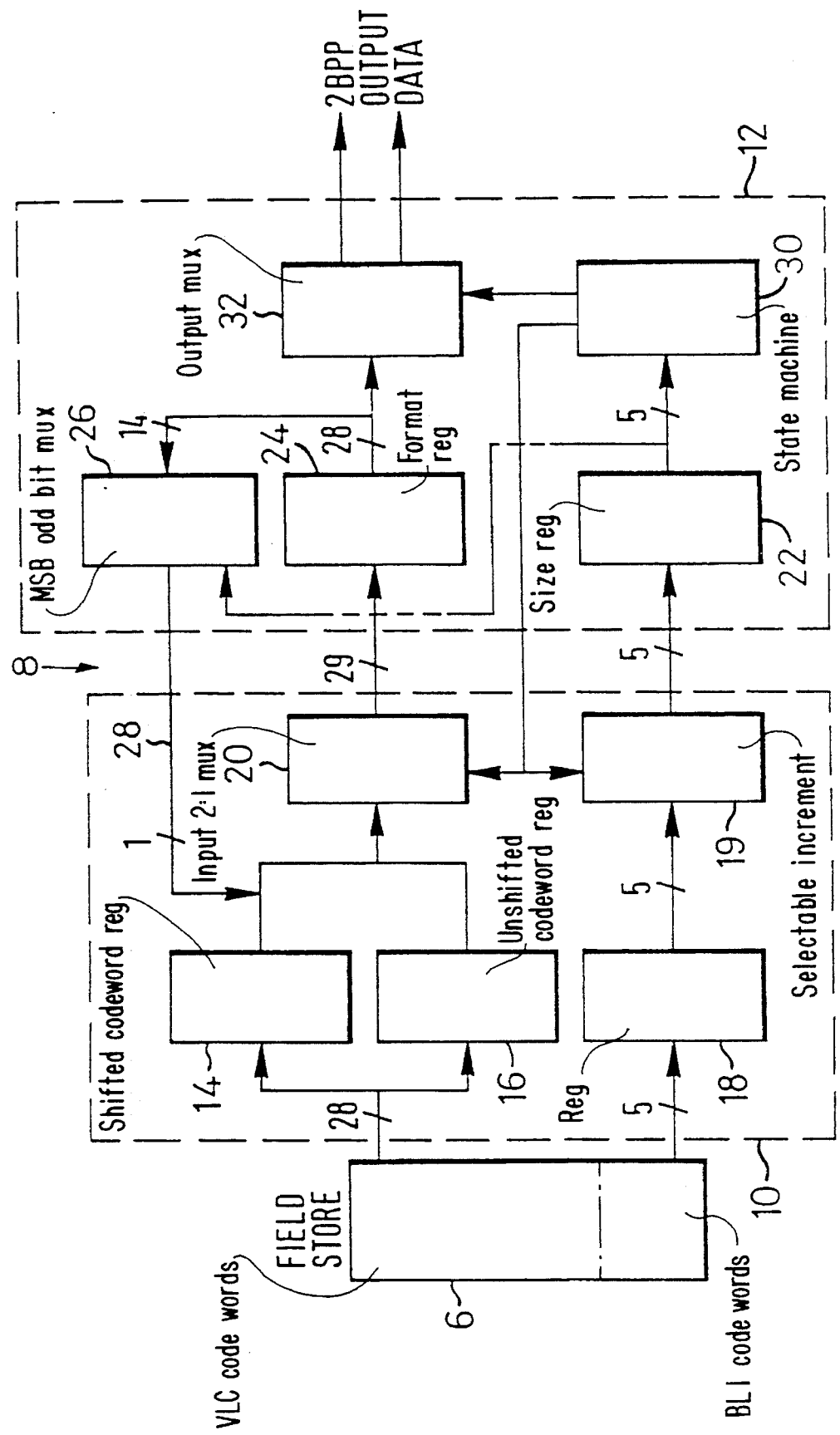
FIG. 2 illustrates a field store and data formatting unit in accordance with one embodiment of the invention.

FIG. 1 shows a system having a field store 6 containing variable bit length code words (VLC) and corresponding bit length indicating code words (BLI). Referring to FIG. 2, the data formatting unit 8 can be considered to comprise a first formatting stage 10 and a second formatting stage 12; it will be understood that whether a particular circuit element is ascribed to belong to a particular stage is a matter of terminology rather than function.

The VLC code words from the field store 6 are fed in parallel to two data registers 14, 16. Data register 14 stores a shifted version of the VLC code word. This shifting is achieved by inputting the VLC code word to the second and subsequent stage of the register counted from the right end of the register. Clearly, its use of the terms right and left is a matter of convention rather than indicating a particular relatively spatial orientation. Data register 16 stores an unshifted version of the VLC code word. The BLI code words corresponding to the VLC code words in the data registers 14, 16 are fed from the field store 6 to another register 18.

One of the versions of the VLC code word from either data register 14 or data register 16 is selected for passing to the second formatting stage 12 by the multiplexer 20. The BLI code word stored in register 18 is passed to the second formatting stage through a selectable increment unit 19 which will either increment the value by one or leave the value unchanged.

Both the VLC code words and the BLI code words passed from the first formatting unit 10 to the second formatting unit 12 have undergone a degree of preprocessing. This preprocessing may have left them unchanged (unshifted code word selected and increment not applied) or may have resulted in changes to them (shifted code word selected and increment applied). In either case, the VLC code word and the BLI code word passed from the first formatting stage 10 to the second formatting stage 12 can be termed preprocessed. The preprocessed bit length indicating code word (PBLI) is stored in size register 22. The preprocessed variable bit length code word (PVLC) is stored in format register 24.

The value stored in the size register 22 is supplied to a bit multiplexer 26 which has the function of using the supplied size to identify which is the most significant bit of the PVLC code word currently stored in the format register 24. When this most significant bit has been identified, its value is returned on remainder bit line 28 to the output side of the shifted code word register 14. This most significant bit is effectively concatenated with the variable length code words stop&d in the shifted code word register 14 by being applied to the right hand stage, or at least the corresponding data line. The return of this most significant bit corresponds to the return of the remainder bit previously discussed. In this case, since the fixed bit length code words being output have only a two bit length, the maximum number of remainder bits is one. If the PVLC code word stored in the format register 24 has an even bit length, then no remainder bit will be produced. If the PVLC code word stored in the format register 24 has an odd bit length, then a single remainder bit will be produced and fed back to the first formatting stage 10. In practice only the odd bits of the format register can give rise to a remainder bit and so only these are connected to the bit multiplexer 26.

The PBLI code word stored in the size register 22 is also fed to a state machine 30. The state machine 30 responds to this input by controlling the output multiplexer 32 to read pairs of bits from the format register 24 which it knows contains valid data until all the valid bits have been read and either a remainder bit has or has not been generated. The two bit fixed bit length data words read From the format register 24 are fed through the output multiplexer 32 onto an output bus.

Another function of the state machine 30 is to control the operation of the multiplexer 20 and the selectable increment unit 19. If the preprocessed bit length indicating code word stored in the size register 22 has an odd value (detectable from the least significant bit stored in the size register 22), then the state machine causes the selectable increment unit 19 to increment the data word that passes through it and the multiplexer 20 to select the shifted code word register 14 to be passed to the second formatting stage 12. Conversely, if the value in the size register 22 is even, then the state machine 30 causes the selectable increment unit 19 to pass the data word unchanged and the multiplexer 20 to select the unshifted code word register 16.

FIG. 3 illustrates the relationship between a number of example VLC code words and their corresponding BLI code words. The desired resulting output of two bit Fixed bit length code words is also shown. Points at which a remainder bit From the second Formatting stage has been returned to the first Formatting stage and concatenated with the following VLC code word are marked with a "*".

The VLC code words are illustrated with their least significant bits on the left hand side and their most significant bits on the right hand side. Each code word is passed through the system with the least significant bits being processed first. Operating in accordance with this convention, it will be seen that none of the VLC code words is a prefix of a longer VLC code word. This is important when decoding the data.

FIG. 4 shows the relationship between the code words in the first formatting stage 10 and the preprocessed code words in the second formatting stage 12. The first code word "00" is of even bit length and can be converted into a single complete fixed length code word (FLC) without any remainder bits. The second code word "100" has an odd bit length of three. The second formatting stage forms a single complete FLC code word of "10" from the input VLC code word and returns the remainder bit of "0" to be concatenated with the following VLC code word of "1010".

This concatenation results in a PVLC code word of "01010" being passed to the second formatting stage. The BLI code word must also be incremented from a value of "4" to "5" in order to properly reflect the increase in bit length that has occurred due to the concatenation.

The processing of the remaining variable bit length code words proceds in the same manner.

Whilst the above described embodiment utilises a two bit output word length, it will be appreciated that the invention is also applicable in circumstances where different bit lengths of output word are required. Similarly, whilst the invention is particularly suited to the processing of video image data, the invention can also be used to process other sorts of data.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A data formatting apparatus for formatting successive input variable length data words into a stream of fixed bit length data words each having a predetermined fixed bit length, said data formatting apparatus comprising:

first storage means for storing each of said variable bit length data words, said first storage means having a bit length storage capacity greater than the aggregate bit length of at least two of said fixed bit length data words;

second storage means for storing bit length indicating words corresponding to said variable bit length data words, respectively;

splitting means for receiving variable length data words from said first storage means and responsive to the respective bit length indicating words in said second storage means for splitting each received variable length data word into at least one data word of said predetermined fixed bit length and a remainder portion which is insufficient in length to form an additional fixed length data word;

incrementing means for selectively incrementing a succeeding bit length indicating word according to the length of said remainder portion;

supplying means for supplying said remainder portion to said first storage means; and concatenating means for concatenating any said remainder portion with a subsequent variable length data word in said first storage means.

2. A data formatting apparatus for formatting successive input variable bit length data words into a stream of fixed bit length data words each having a predetermined fixed bit length, said data formatting apparatus comprising:

first storage means for storing each of said variable bit length data words, said first storage means having a bit length storage capacity greater than the aggregate bit length of at least two of said fixed bit length data words and having a plurality of plural-stage data registers, one of said data registers storing unshifted versions of said successive input variable bit length data words and the remaining data registers storing said variable bit length data words supplied to stages therein which are left-shifted by differing amounts;

second storage means for storing bit length indicating words corresponding to said variable bit length data words, respectively;

splitting means for receiving variable bit length data words from said first storage means and responsive to the respective bit length indicating words in said second storage means for splitting each received variable bit length data word into at least one data word of said predetermined fixed bit length and a remainder portion which is insufficient in length to form an additional fixed length data word;

determining means for determining whether a remainder portion is formed by said splitting means;

incrementing means for selectively incrementing a succeeding bit length indicating word according to the length of said determined remainder portion;

supplying means for supplying said remainder portion to said first storage means; and concatenating means for concatenating any said remainder portion with a subsequent variable bit length data word in said first storage means.

3. The data formatting apparatus as claimed in claim 2, wherein said remainder portion is concatenated with said subsequent variable length data word by being written into those stages of said remaining data registers that are not occupied by bits of said subsequent variable length data word.

4. The data formatting apparatus as claimed in claim 2, further comprising selecting means coupling said plurality of plural-stage data registers to said splitting means for selecting said unshifted versions of said variable length data words or the left-shifted data words, stored in said plurality of plural-stage data registers to be supplied to said splitting means.

5. The data formatting apparatus as claimed in claim 1, wherein said incrementing means is responsive to a stored bit length indicating word to determine the amount by which said succeeding bit length indicating word is incremented.

6. The data formatting apparatus as claimed in claim 5, wherein said splitting means includes a format register for storing a predetermined fixed bit length data word, an output multiplexer coupled to said format register, and an output data bus, whereby said output multiplexer receives said predetermined fixed bit length data words stored in said format register and supplies said predetermined fixed length data words to said output data bus.

7. A data formatting apparatus for formatting successive input variable bit length data words into a stream of fixed bit length data words each having a predetermined fixed bit length, said data formatting apparatus comprising:

first storage means for storing each of said variable bit length data words, said first storage means having a bit length storage capacity greater than the aggregate bit length of at least two of said fixed bit length data words;

second storage means for storing bit length indicating words corresponding to said variable bit length data words, respectively;

splitting means for receiving variable bit length data words from said first storage means and responsive to the respective bit length indicating words in said second storage means for splitting each received variable bit length data word into at least one data word of said predetermined fixed bit length and a remainder portion which is insufficient in length to form an additional fixed length data word;

determining means for determining whether a remainder portion is formed by said splitting means;

incrementing means, responsive to a stored bit length indicating word, for incrementing a succeeding bit length indicating word according to the length of said determined remainder portion;

a size register coupled to said incrementing means for receiving and storing said bit length indicating words and to selectively control said incrementing means to selectively increment said succeeding bit length indicating word depending upon whether the bit length indicating word stored in said size register is of odd or even value;

supplying means for supplying said remainder portion to said first storage means; and concatenating means for concatenating any said remainder portion with a subsequent variable bit length data word in said first storage means.

8. A data formatting method for formatting successive input variable bit length data words into a stream of fixed bit length data words each having a predetermined fixed bit length, said data formatting method comprising the steps of:

storing each of said variable bit length data words in a memory store having a bit length storage capacity greater than the aggregate bit length of at least two of said fixed bit length data words;

storing bit length indicating words corresponding to each of said variable bit length data words, respectively;

splitting, responsive to the respective bit length indicating words, each stored variable length data word into at least one data word of said predetermined fixed bit length and a remainder portion which is insufficient in length to form an additional fixed length data word;

incrementing a succeeding bit length indicating word according to the length of said remainder portion; and concatenating any said remainder portion with a subsequent variable length data word in said first step of storing.

* * * * *